(12) United States Patent
Xie et al.

(10) Patent No.: US 12,416,945 B2
(45) Date of Patent: Sep. 16, 2025

(54) SUPPORT BACKPLANE, FLEXIBLE DISPLAY SCREEN, AND ELECTRONIC DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zhihao Xie, Beijing (CN); Binfeng Feng, Beijing (CN); Bowen Xiao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 178 days.

(21) Appl. No.: 17/790,860

(22) PCT Filed: Jun. 3, 2021

(86) PCT No.: PCT/CN2021/098161
§ 371 (c)(1),
(2) Date: Jul. 5, 2022

(87) PCT Pub. No.: WO2021/254163
PCT Pub. Date: Dec. 23, 2021

(65) Prior Publication Data
US 2023/0034440 A1    Feb. 2, 2023

(30) Foreign Application Priority Data

Jun. 16, 2020    (CN) .......................... 202010549146.7

(51) Int. Cl.
*G06F 1/16* (2006.01)

(52) U.S. Cl.
CPC .......... *G06F 1/1656* (2013.01); *G06F 1/1616* (2013.01); *G06F 1/1641* (2013.01); *G06F 1/1652* (2013.01)

(58) Field of Classification Search
CPC .... G06F 1/1656; G06F 1/1616; G06F 1/1641; G06F 1/1652; G06F 1/1615;
(Continued)

(56) References Cited

U.S. PATENT DOCUMENTS 9,779,653 B2 * 10/2017 Ikeda ...................... G09F 9/301
9,829,923 B2 * 11/2017 Lee ........................ G06F 1/1652
(Continued)

FOREIGN PATENT DOCUMENTS

CN    103399616 A    11/2013
CN    104137168 A    11/2014
(Continued)

OTHER PUBLICATIONS

The First Office Action for the Chinese Patent Application No. 202010549146.7 issued by the Chinese Patent Office on Jul. 27, 2021.
(Continued)

*Primary Examiner* — Rockshana D Chowdhury
(74) *Attorney, Agent, or Firm* — XSENSUS LLP

(57) ABSTRACT

A support backplane includes a first support portion, a second support portion, and a third support portion connected in sequence. The first support portion has a first rollable flexible structure in a first area, and the first area is a partial area of the first support portion. The second support portion has a second rollable flexible structure in a second area, and the second area is a partial area of the second support portion. The second rollable flexible structure is matched with the first rollable flexible structure, so as to constitute a foldable structure in the first area and the second
(Continued)

area. The third support portion has a third rollable flexible structure in an entire area of the third support portion, so that the third support portion constitutes a slidably rolled structure that is able to be unfolded or rolled up.

20 Claims, 8 Drawing Sheets

(58) Field of Classification Search
CPC ............ G02F 1/133305; H10K 77/111; H10K 2102/311; G09F 9/301
See application file for complete search history.

(56) References Cited

U.S. PATENT DOCUMENTS

| | | | | |
|---|---|---|---|---|
| 10,379,577 B2* | 8/2019 | Yeom | ................... | G06F 1/1652 |
| 10,514,724 B2* | 12/2019 | Hamburgen | ........... | H10K 59/40 |
| 10,613,586 B2* | 4/2020 | Yamazaki | ............. | H10K 77/111 |
| 10,636,277 B2* | 4/2020 | Lin | .......................... | G08B 6/00 |
| 10,798,831 B2* | 10/2020 | Shin | .................... | H05K 5/0217 |
| 10,820,433 B2* | 10/2020 | Cha | ....................... | H05K 5/0226 |
| 10,909,889 B2* | 2/2021 | Lee | ........................ | G09F 9/301 |
| 11,644,868 B2* | 5/2023 | Kim | ...................... | G06F 1/1641 |
| | | | | 361/679.27 |
| 11,789,497 B2* | 10/2023 | Yamazaki | ................. | G09F 9/40 |
| | | | | 361/679.02 |
| 11,792,945 B2* | 10/2023 | Yao | .................... | H04M 1/0235 |
| | | | | 361/749 |
| 11,810,482 B2* | 11/2023 | Wu | ....................... | G06F 1/1635 |
| 11,842,659 B2* | 12/2023 | Khachatryan | ......... | G06F 1/1652 |
| 11,846,995 B2* | 12/2023 | Kim | ...................... | G06F 1/1652 |
| 11,899,494 B2* | 2/2024 | Zhang | .................. | G06F 1/1624 |
| 11,907,019 B2* | 2/2024 | Soh | ....................... | G06F 1/1652 |
| 2005/0246650 A1 | 11/2005 | Yeung et al. | | |
| 2009/0021666 A1* | 1/2009 | Chen | ................. | G02F 1/133305 |
| | | | | 349/73 |
| 2013/0222998 A1* | 8/2013 | Cho | ..................... | G06F 1/1601 |
| | | | | 361/679.27 |
| 2015/0016126 A1* | 1/2015 | Hirakata | ............... | F21V 15/012 |
| | | | | 362/418 |
| 2015/0146386 A1* | 5/2015 | Namkung | ............. | H05K 1/028 |
| | | | | 361/749 |
| 2015/0220188 A1 | 8/2015 | Zhao | | |
| 2016/0120022 A1* | 4/2016 | Lee | ..................... | H04M 1/0268 |
| | | | | 361/749 |
| 2016/0212840 A1 | 7/2016 | Koo et al. | | |
| 2017/0025634 A1 | 1/2017 | Jeong | | |
| 2017/0064845 A1* | 3/2017 | Jung | ................ | G02F 1/133305 |
| 2017/0186400 A1 | 6/2017 | Song et al. | | |
| 2018/0033830 A1* | 2/2018 | Kim | ..................... | H10K 59/131 |
| 2018/0103552 A1* | 4/2018 | Seo | ......................... | G09F 9/301 |
| 2018/0190936 A1 | 7/2018 | Lee et al. | | |
| 2019/0141843 A1* | 5/2019 | Park | ..................... | H10K 50/841 |
| 2020/0170127 A1* | 5/2020 | Kim | ..................... | H05K 5/0226 |
| 2021/0168929 A1* | 6/2021 | Wang | .................... | H05K 1/028 |
| 2021/0227704 A1* | 7/2021 | Bi | ........................ | H10K 77/111 |
| 2021/0333837 A1 | 10/2021 | Xu et al. | | |

FOREIGN PATENT DOCUMENTS

| | | |
|---|---|---|
| CN | 104933964 A | 9/2015 |
| CN | 105810104 A | 7/2016 |
| CN | 107437378 A | 12/2017 |
| CN | 108268170 A | 7/2018 |
| CN | 108417152 A | 8/2018 |
| CN | 110853520 A | 2/2020 |
| CN | 111261049 A | 6/2020 |
| CN | 111722674 A | 9/2020 |

OTHER PUBLICATIONS

The Second Office Action for the Chinese Patent Application No. 202010549146.7 issued by the Chinese Patent Office on Apr. 18, 2022.

The Third Action for the Chinese Patent Application No. 202010549146.7 issued by the Chinese Patent Office on Oct. 8, 2022.

* cited by examiner

SUPPORT BACKPLANE, FLEXIBLE DISPLAY SCREEN, AND ELECTRONIC DEVICE

CROSS-REFERENCE TO RELATED APPLICATIONS

This application is a national phase entry under 35 USC 371 of International Patent Application No. PCT/CN 2021/098161 filed on Jun. 3, 2021, which claims priority to Chinese Patent Application No. 202010549146.7, filed on Jun. 16, 2020, which are incorporated herein by reference in their entirety.

TECHNICAL FIELD

The present disclosure relates to the field of display technologies, and in particular, to a support backplane, a flexible display screen, and an electronic device.

BACKGROUND

With the wider and wider application of flexible display screens, there are more and more foldable mobile devices at present. A two-part screen of a foldable mobile device may be folded in half or folded back by 180 degrees. That is, the folded two-part screen is in a face-to-face state or a back-to-back state.

SUMMARY

In an aspect, a support backplane is provided. The support backplane includes a first support portion, a second support portion and a third support portion that are connected in sequence. The first support portion has a first rollable flexible structure in a first area, and the first area is a partial area of the first support portion. The second support portion has a second rollable flexible structure in a second area, and the second area is a partial area of the second support portion. The second rollable flexible structure is matched with the first rollable flexible structure, so as to constitute a foldable structure in the first area and the second area. The third support portion has a third rollable flexible structure in an entire area of the third support portion, so that the third support portion constitutes a slidably rolled structure that is able to be unfolded or rolled up.

In some embodiments, the first area is a partial area of the first support portion close to the second support portion, and the second area is a partial area of the second support portion close to the first support portion. The first area is adjacent to the second area. The first rollable flexible structure is connected to the second rollable flexible structure.

In some embodiments, the first support portion, the second support portion and the third support portion are connected in sequence in a first direction.

In some embodiments, at least one of the first rollable flexible structure, the second rollable flexible structure and the third rollable flexible structure includes a single-stage rollable flexible structure. The single-stage rollable flexible structure includes a plurality of support strips arranged according to a predetermined layout.

In some embodiments, the first rollable flexible structure includes the single-stage rollable flexible structure, and the second rollable flexible structure includes the single-stage rollable flexible structure.

In some embodiments, the third rollable flexible structure includes the single-stage rollable flexible structure.

In some embodiments, the support strips are made of metal.

In some embodiments, the predetermined layout includes a case that the plurality of support strips are arranged at intervals in sequence in the first direction.

In some embodiments, the predetermined layout further includes a case that each of the plurality of support strips extends in a second direction perpendicular to the first direction.

In some embodiments, at least one of the first rollable flexible structure, the second rollable flexible structure and the third rollable flexible structure includes a multi-stage rollable flexible structure, and the multi-stage rollable flexible structure is a support plate with a plurality of through holes.

In some embodiments, the first rollable flexible structure includes the multi-stage rollable flexible structure, and the second rollable flexible structure includes the multi-stage rollable flexible structure.

In some embodiments, the third rollable flexible structure includes the multi-stage rollable flexible structure.

In some embodiments, the support plate is made of metal.

In some embodiments, the plurality of through holes in the multi-stage rollable flexible structure are arranged in a plurality of rows, and all of through holes in each row are arranged at intervals in sequence in the first direction.

In some embodiments, through holes in a row are staggered from through holes in an adjacent row.

In some embodiments, the plurality of through holes are strip-shaped holes extending in a second direction perpendicular to the first direction. Widths of through holes in a same row are equal.

In some embodiments, the plurality of through holes are manufactured by etching.

In some embodiments, the support backplane in any one of the above embodiments further includes a flexible connection layer.

The first support portion, the second support portion and the third support portion are disposed on a surface of the flexible connection layer.

In some embodiments, in a case where the single-stage rollable flexible structure includes the plurality of support strips, the flexible connection layer includes first filling portions each embedded into a gap between adjacent support strips; and/or in a case where the multi-stage rollable flexible structure includes the support plate with the plurality of through holes, the flexible connection layer includes second filling portions each embedded into a through hole in the plurality of through holes.

In some embodiments, a material of the flexible connection layer includes silica gel; or the flexible connection layer is a silica gel layer formed by injection molding.

In another aspect, a flexible display screen is provided. The flexible display screen includes the support backplane in any one of the above embodiments.

In yet another aspect, an electronic device is provided. The electronic device includes the flexible display screen in any one of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal to which the embodiments of the present disclosure relate.

DETAILED DESCRIPTION

Figure 1A:
FIG. 1A is a structural diagram of an electronic device, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "connected" and extensions thereof may be used. For example, the term "connected" may be used in the description of some embodiments to indicate that two or more components are in direct physical contact or electrical contact with each other. The embodiments disclosed herein are not necessarily limited to the contents herein.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

As used herein, the term such as "parallel," "perpendicular" or "equal" includes a stated condition and condition(s) similar to the stated condition. The similar condition(s) are within an acceptable range of deviation as determined by a person of ordinary skill in the art, considering measurement in question and errors associated with measurement of a particular quantity (i.e., limitations of a measurement system). For example, the term "parallel" includes absolutely parallel and approximately parallel, and for approximately parallel, an acceptable range of deviation may be, for example, within 5°. The term "perpendicular" includes absolutely perpendicular and approximately perpendicular, and for approximately perpendicular, an acceptable range of deviation may also be, for example, within 5°. The term "equal" includes absolutely equal and approximately equal, and for approximately equal, an acceptable range of deviation may be that, for example, a difference between two that are equal to each other is less than or equal to 5% of any one of the two.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

As shown in FIG. 1A, some embodiments of the present disclosure provide an electronic device 100. The electronic device 100 may be an electronic device with a flexible screen, such as a mobile phone, a tablet computer, a notebook computer, an ultra-mobile personal computer (UMPC), a hand-held computer, a netbook, a personal digital assistant (PDA), a wearable device, or a virtual reality device. The application of the electronic device 100 is not specifically limited.

The electronic device 100 includes a flexible display screen 200. For example, the electronic device 100 may further include user interface components (input/output components), such as buttons, microphones, speakers, piezoelectric actuators (for receiving electrical input from a user or providing tactile feedback to a user) or other actuators such as vibrators, pressure sensors and other components, and these components may be installed in other areas of the electronic device other than the flexible display screen 200. The electronic device 100 in the embodiments of the present disclosure may further include more or fewer components, and relative positions between these components may be changed.

Figure 1B:
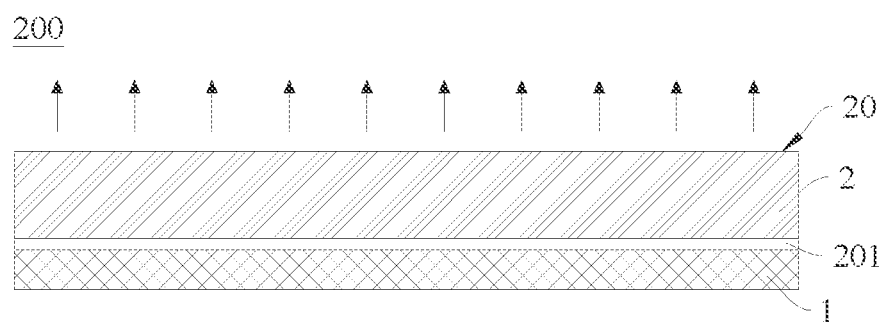
FIG. 1B is a structural diagram of a flexible display screen, in accordance with some embodiments.

As shown in FIG. 1B, some embodiments of the present disclosure provide the flexible display screen 200. The flexible display screen 200 may be applied to any electronic device 100 describe above.

For example, the flexible display screen 200 may be an electroluminescent display screen or a photoluminescent display screen. In a case where the flexible display screen 200 is the electroluminescent display screen, the electroluminescent display screen may be an organic light-emitting diode (OLED) display screen, or a quantum dot light-emitting diode (QLED) display screen. In a case where the flexible display screen is the photoluminescent display screen, the photoluminescent display screen may be a quantum dot photoluminescent display screen.

In some embodiments, as shown in FIG. 1B, the flexible display screen 200 includes a display panel 2 and a support backplane 1 disposed on a back of the display panel 2.

Since the flexible display screen 200 has the functions of folding and bending, the display panel 2 here is a flexible display panel, and may be bent according to application requirements. The support backplane 1 provides support for the flexible display panel. That is, the support backplane 1 may be bent along with the bending of the flexible display panel.

In some examples, the display panel 2 and the support backplane 1 are fixed together by an adhesive. That is, as shown in FIG. 1B, a first adhesive layer 201 is provided between the display panel 2 and the support backplane 1.

Here, a material of the first adhesive layer 201 includes a thermosetting resin or a photocurable resin. For example, the first adhesive layer 201 is made of a pressure-sensitive adhesive, such as an acrylate pressure-sensitive adhesive.

Of course, the display panel 2 and the support backplane 1 may be fixed together by other structures, such as fasteners or buckles. The fixing mode of the display panel 2 and the backplane 1 is not limited in the embodiments of the present disclosure, as long as the fixing of the display panel 2 and the backplane 1 is able to be realized.

Figure 10:
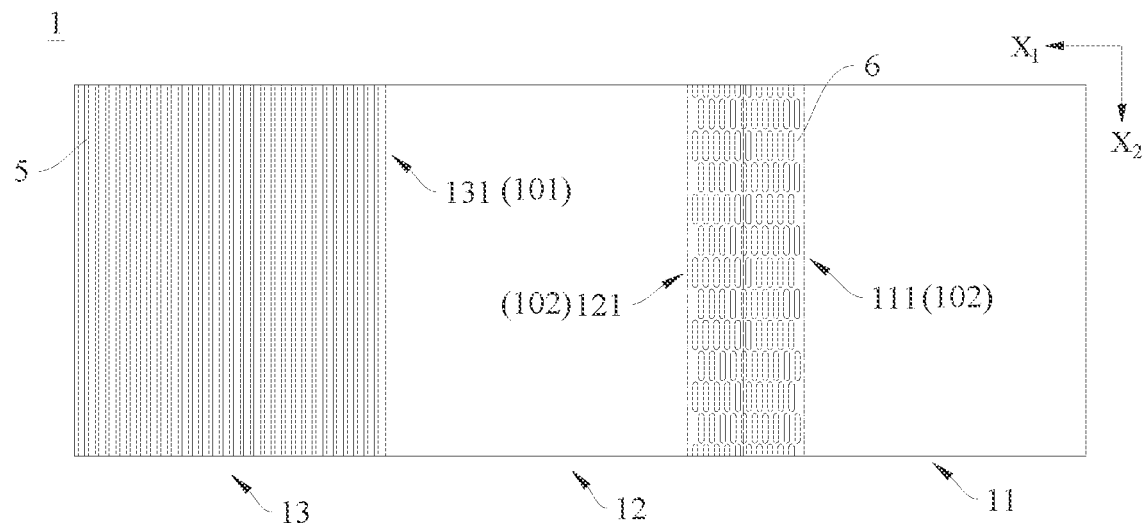
FIG. 10 is a bottom structural diagram of yet another support backplane, in accordance with some embodiments.

In some embodiments, as shown in FIG. 10, the flexible display screen 200 further includes a cover plate 3.

For example, the cover plate 3 is a foldable cover plate, and the cover plate 3 may be made of colorless polyimide (CPI), or ultra-thin glass (UTG).

Figure 1C:
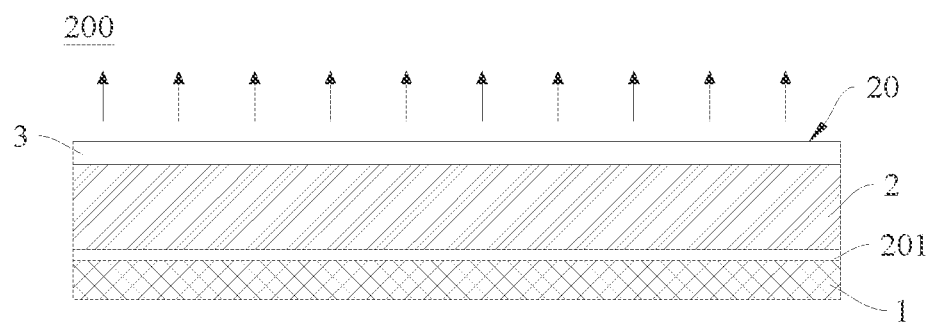
FIG. 1C is a structural diagram of another flexible display screen, in accordance with some embodiments.
Figure 1D:
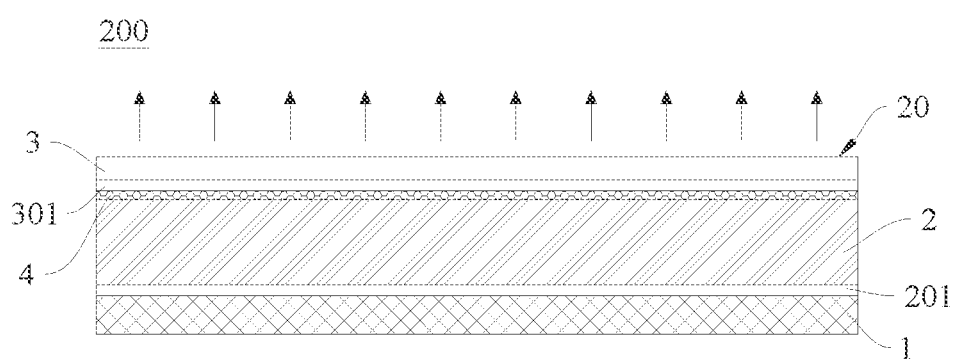
FIG. 1D is a structural diagram of yet another flexible display screen, in accordance with some embodiments.

In some embodiments, as shown in FIG. 1D, an antireflection layer 4 is provided between the display panel 2 and the cover plate 3. The cover plate 3 and the antireflective layer 4 are fixed together by an adhesive. As shown in FIG. 1D, a second adhesive layer 301 is provided between the antireflective layer 4 and the cover plate 3.

Here, a material of the second adhesive layer 301 includes a thermosetting resin or a photocurable resin. For example, the second adhesive layer 301 is made of a pressure-sensitive adhesive, such as the acrylate pressure-sensitive adhesive.

In some embodiments, the flexible display screen 200 further includes a circuit board and other electronic accessories. Of course, the flexible display screen 200 in some embodiments of the present disclosure may further include more or fewer components, and relative positions between these components may be changed.

The circuit board is configured to provide signals required for display to the display panel 2, so that a display image may be viewed at a display side 20 of the flexible display screen 200. For example, the circuit board is a printed circuit board assembly (PCBA). The PCBA includes a printed circuit board (PCB), and a timing controller (TCON), a power management integrated circuit (PMIC) and other ICs or circuits that are all disposed on the PCB.

Figure 2:
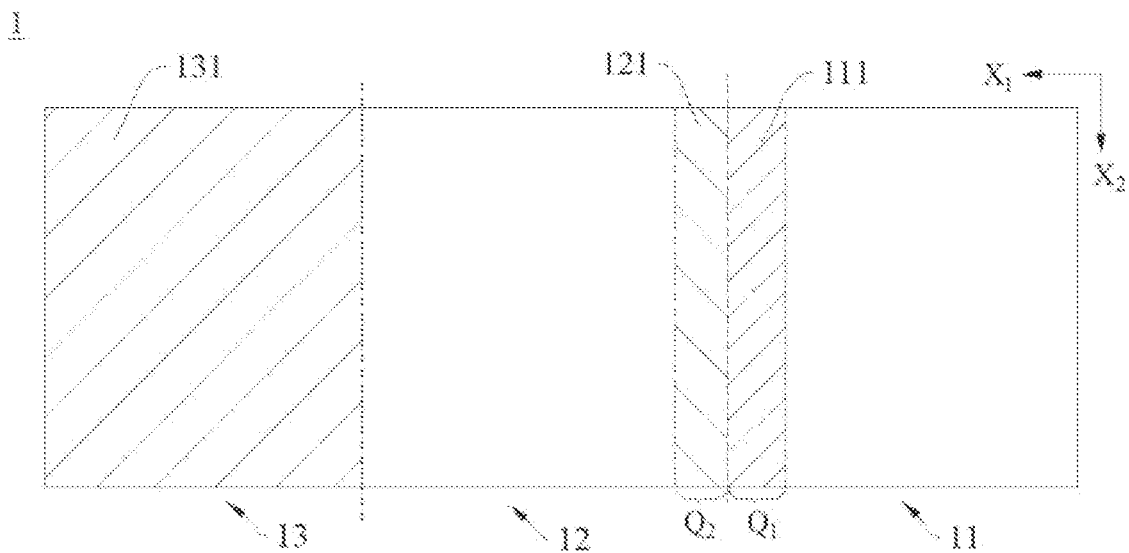
FIG. 2 is a front structural diagram of a support backplane, in accordance with some embodiments.

Some embodiments of the present disclosure provide the support backplane 1, which may be applied to the flexible display screen 200 in any one of the embodiments. As shown in FIG. 2, the support backplane 1 includes a first support portion 11, a second support portion 12 and a third support portion 13 that are connected in sequence.

The first support portion 11 has a first rollable flexible structure 111 in a first area $Q_1$, and the first area $Q_1$ is a partial area of the first support portion 11. The second support portion 12 has a second rollable flexible structure 121 in a second area $Q_2$, and the second area $Q_2$ is a partial area of the second support portion 12. The second rollable flexible structure 121 is matched with the first rollable flexible structure 111, so as to constitute a foldable structure in the first area $Q_1$ and the second area $Q_2$. The third support portion 13 has a third rollable flexible structure 131 in its entire area, so that the third support portion 13 constitutes a slidably rolled structure that may be unfolded or rolled up.

It will be noted that the shapes of the first support portion 11, the second support portion 12 and the third support portion 13 may be set according to support requirements and the structure of the flexible display screen 200. In some examples, referring to FIG. 2, the first support portion 11, the second support portion 12 and the third support portion 13 are each in a rectangular shape in a front view of the support backplane 1.

Here, in the phrase "the first support portion 11, the second support portion 12 and the third support portion 13 that are connected in sequence", the phrase "in sequence" is only used to define a connection order of the first support portion 11, the second support portion 12 and the third support portion 13, not an arrangement direction. For example, referring to FIG. 2, the first support portion 11 and the third support portion 13 are respectively disposed on two opposite sides of the second support portion 12 (i.e., the first support portion 11, the second support portion 12 and the third support portion 13 may be arranged in a same direction). Alternatively, referring to FIG. 3, the first support portion 11 and the third support portion 13 are respectively disposed on two adjacent sides of the second support portion 12. A specific arrangement of the first support portion 11, the second support portion 12 and the third support portion 13 should be matched with the screen structure and function requirements of the flexible display screen 200, and details are not described here.

For example, the first rollable flexible structure 111, the second rollable flexible structure 121 and the third rollable flexible structure 131 are each made of a material with a certain toughness and rigidity, such as metal, glass, ceramic or an organic material. The toughness of the material ensures a recovery capability of the support backplane 1 after being bent or slidably rolled up, and a flatness of the support backplane after being unfolded. The rigidity of the material ensures a support performance of the support backplane 1.

In some examples, the first rollable flexible structure 111, the second rollable flexible structure 121 and the third rollable flexible structure 131 are each made of a metal material, such as a stainless steel (e.g., SUS304 or SUS316) or a titanium alloy. These materials have a high rigidity and toughness, and may be matched with various requirements of the flexible display screen.

The support backplane 1 in some embodiments of the present disclosure includes three support portions, i.e., the first support portion 11, the second support portion 12 and the third support portion 13. The first support portion 11 and the second support portion 12 have the foldable structure. Moreover, the third support portion 13 is integrally designed to be a rollable flexible structure, and is connected to the second support portion 12, and after the first support portion 11 and the second support portion 12 are completely unfolded, the third support portion 13 may be completely or partially unfolded. In this design, an overall appearance size of the electronic device having the support backplane 1 may be reduced by folding and rolling up, and a size of a display area of the electronic device may be increased by unfolding. Therefore, in a case of a certain folding size of the electronic device, the size of the display area may be linearly adjusted within a certain range according to needs, which helps to improve the user experience.

Figure 4:
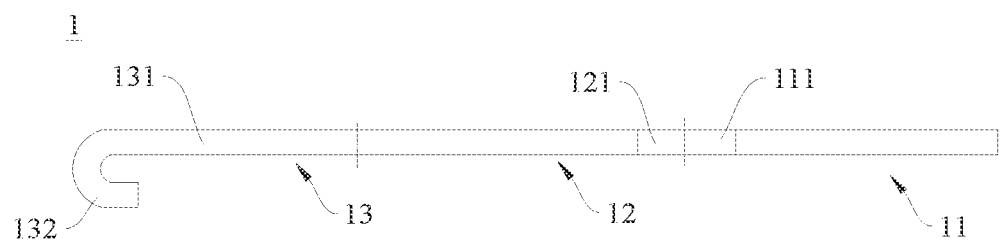
FIG. 4 is a bottom structural diagram of a support backplane that is completely unfolded, in accordance with some embodiments.
Figure 5:
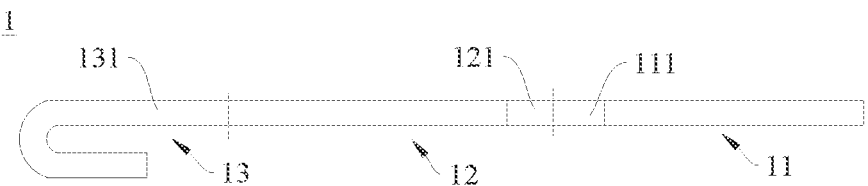
FIG. 5 is a bottom structural diagram of a support backplane that is half unfolded, in accordance with some embodiments.

In some examples, referring to FIG. 4, FIG. 4 is a bottom structural diagram of the support backplane 1. Since the third support portion 13 is integrally designed to be the rollable flexible structure, the third support portion 13 may be rolled up on a slidable reel. In this case, an end of the third support portion 13 may exhibit a U-shaped folded structure 132. Of course, the U-shaped folded structure 132 is merely schematic, and a person skilled in the art may design the third support portion 13 without the U-shaped folded structure 132. The U-shaped folded structure 132 designed in figures is only intended to show that the third support portion 13 is the slidably rolled structure that may be unfolded or rolled up. Referring to FIG. 5, the third support portion 13 is in a half-unfolded state, and in this case, the U-shaped folded structure 132 of the third support portion 13 is not clearly shown. That is, the U-shaped folded structure 132 may be shown when the third support portion 13 is in a completely unfolded state. The U-shaped folded structure 132 in FIG. 4 may be equivalent to a lock catch, so as to ensure that the third support portion 13 cannot be further unfolded when the third support portion 13 is unfolded to this state.

Figure 3:
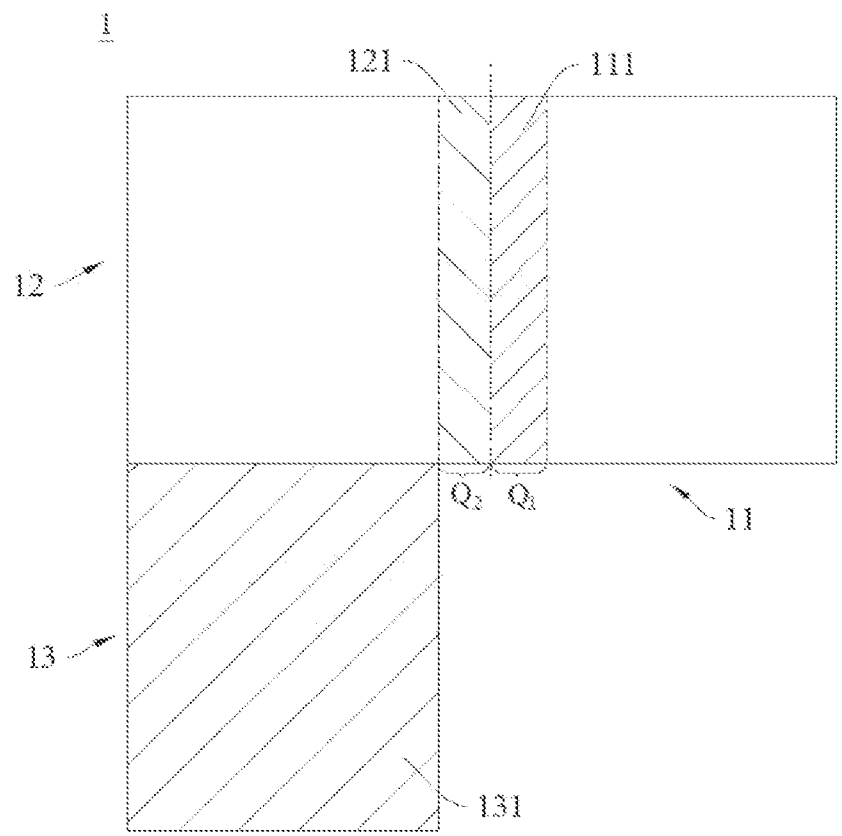
FIG. 3 is a front structural diagram of another support backplane, in accordance with some embodiments.

In some embodiments, referring to FIGS. 2 and 3, the first area $Q_1$ is a partial area of the first support portion 11 close to the second support portion 12, the second area $Q_2$ is a partial area of the second support portion 12 close to the first support portion 11, and the first area $Q_1$ is adjacent to the second area $Q_2$. In this case, the second rollable flexible structure 121 is matched with the first rollable flexible structure 111, which may be that the first rollable flexible structure 111 is connected to the second rollable flexible structure 121.

In this way, the foldable structure is constituted at a position where the first support portion 11 and the second support portion 12 are connected, so that the first support portion 11 and the second support portion 12 may be directly folded in half in a face-to-face or a back-to-back manner.

In some embodiments, referring to FIG. 2, the first support portion 11, the second support portion 12 and the third support portion 13 are connected in sequence in a first direction $X_1$.

In some examples, the first direction is not used to limit a specific direction, but means that the first support portion 11, the second support portion 12 and the third support portion 13 are arranged in sequence in a same linear direction. For example, in FIG. 2, the first direction $X_1$ is directed from the right side to the left side. The first support portion 11, the second support portion 12 and the third support portion 13 are connected in sequence in the first direction $X_1$, so that a dimension of the support backplane 1 may be adjusted in a linear direction.

Figure 6:
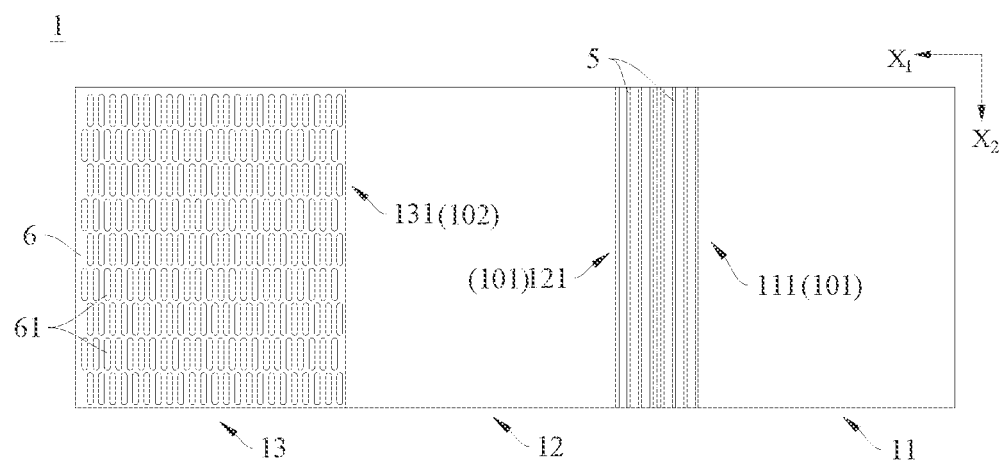
FIG. 6 is a bottom structural diagram of another support backplane, in accordance with some embodiments.
Figure 7:
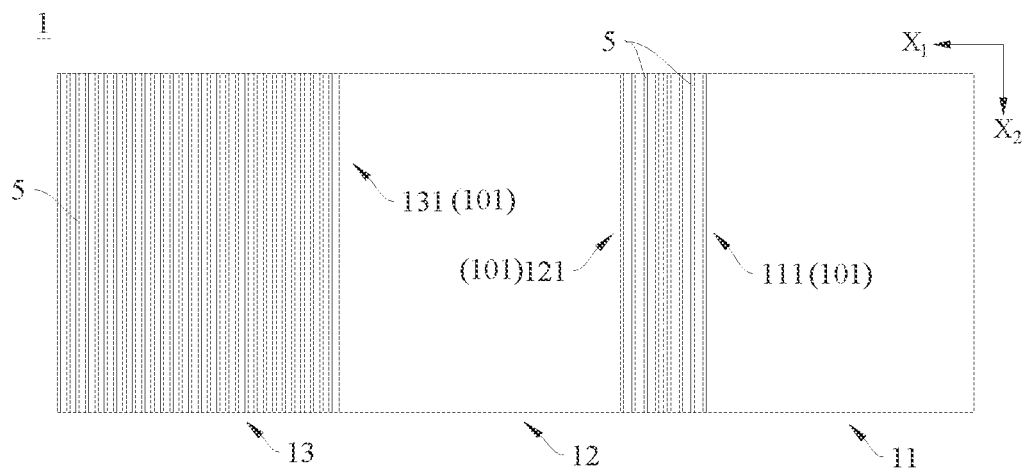
FIG. 7 is a bottom structural diagram of yet another support backplane, in accordance with some embodiments.

In some embodiments, referring to FIGS. 6, 7 and 10, at least one of the first rollable flexible structure 111, the second rollable flexible structure 121 and the third rollable flexible structure 131 includes a single-stage rollable flexible structure 101. The single-stage rollable flexible structure 101 includes a plurality of support strips 5 arranged according to a predetermined layout.

The single-stage rollable flexible structure is formed by using the plurality of support strips 5, and the single-stage rollable flexible structure 101 formed by the plurality of independent support strips 5 has a better extension and deformation performance in an arrangement direction of the support strips 5, which is able to be better adapted to the folding or bending action of the support backplane 1 in the arrangement direction, thereby ensuring that the support backplane 1 has a good deformation and recovery capability at a folding position, so as to avoid a structural breakage caused by the folding or bending for many times.

For example, the phrase "predetermined layout" means that the plurality of support strips 5 are arranged according to a specific rule, not in a disordered arrangement. The plurality of support strips 5 may be arranged at intervals or compactly arranged. The specific arrangement may be set according to a material, size and shape of the support strip 5, as long as the layout of the support strips 5 may satisfy the folding function of the single-stage rollable flexible structure 101.

For another example, the shape of the support strip 5 is not specifically limited, and a cross section of the support strip 5 may be rectangular, circular, oval or trapezoidal. In order to ensure the uniformity of the entire structure, the plurality of support strips 5 are in the same shape and specification. Therefore, the plurality of support strips 5 may form a plane that is the same as a plane formed by a main body of the support backplane 1, so as to ensure that the support backplane 1 has a flat surface, so that the support backplane 1 is conveniently attached to and fixed with the flexible display screen, and the support backplane has a good support effect on the display panel 2.

In some embodiments, referring to FIGS. 6 and 7, the first rollable flexible structure 111 and the second rollable flexible structure 121 each include the single-stage rollable flexible structure 101.

In a case where the first rollable flexible structure 111 and the second rollable flexible structure 121 each include the single-stage rollable flexible structure 101, for example, in an actual production, the first rollable flexible structure 111 and the second rollable flexible structure 121 may be manufactured by using an integrated forming process.

In some embodiments, referring to FIGS. 7 and 10, the third rollable flexible structure 131 includes the single-stage rollable flexible structure 101.

Since the single-stage rollable flexible structure 101 is formed by using the plurality of support strips 5, and the plurality of support strips 5 have a good extension and deformation performance in the arrangement direction, the third rollable flexible structure 131 includes the single-stage rollable flexible structure 101, which may be better adapted to the sliding and rolling movement of the third rollable flexible structure 131 by setting the arrangement direction of the plurality of support strips 5.

For example, referring to FIG. 7, the first rollable flexible structure 111, the second rollable flexible structure 121 and the third rollable flexible structure 131 each include the single-stage rollable flexible structure 101. In this case, the first rollable flexible structure 111, the second rollable flexible structure 121 and the third rollable flexible structure 131 may be formed by using a same process, and the first rollable flexible structure 111 and the second rollable flexible structure 121 may be integrally formed.

In some embodiments, the support strips 5 are made of metal. For example, the metal may be a stainless steel (e.g., SUS304 or SUS316) or a titanium alloy. These materials have a suitable rigidity and toughness, and may meet the bending or folding requirements of the support backplane 1.

In some embodiments, referring to FIGS. 6, 7 and 10, the predetermined layout includes a case that the plurality of support strips 5 are arranged at intervals in sequence in the first direction $X_1$.

For example, a dimension of an interval between adjacent support strips 5 is not specifically limited here, and may be set according to specific conditions. Moreover, dimensions of the intervals formed by the plurality of support strips 5 arranged at intervals may be the same or different. That is, the support strips 5 may be arranged at even intervals, or arranged at uneven intervals. For example, a dimension of an interval between adjacent support strips 5 may be appropriately increased at a position with large deformation, so as to increase the deformability of the support strips 5. A dimension of an interval between adjacent support strips 5 may be appropriately reduced at a position that needs supporting, so as to improve the support capability of the support strips 5.

In some embodiments, referring to FIGS. 6, 7 and 10, the predetermined layout further includes a case that each of the plurality of support strips 5 extends in a second direction $X_2$ perpendicular to the first direction $X_1$.

The arrangement direction of the support strips 5 is the same as a sliding direction of the third support portion 13, and an extending direction of each support strip 5 is perpendicular to the arrangement direction of the support strips 5. In this way, when the third support portion 13 is slidably rolled up, the intervals between the support strips 5 may be adapted to a change of the structure dimension during the sliding and rolling, which is conducive to reducing the deformation of the support strips 5 and an acting force of the support strips 5 on other structures, so that the support strips 5 have a good support effect.

In some embodiments, referring to FIGS. 6 and 8 to 10, at least one of the first rollable flexible structure 111, the second rollable flexible structure 121 and the third rollable flexible structure 131 includes a multi-stage rollable flexible structure 102. The multi-stage rollable flexible structure 102 is a support plate 6 with a plurality of through holes 61.

The multi-stage rollable flexible structure 102 is the support plate in which the plurality of through holes 61 are disposed. The through holes 61 are used for reducing a rigidity of the support plate 6 to increase the deformability of the support plate 6. The through holes 61 are disposed to release a pressure generated when the support plate 6 is folded, so as to ensure that the support plate 6 is easily folded and difficultly broken when the support plate 6 is folded repeatedly.

For example, a sectional shape of the through hole 61 in the support plate 6 (i.e., a shape of a section perpendicular to an axis direction of the through hole 61) is not specifically limited. For example, the sectional shape of the through hole 61 may be rectangular, circular or oval. Alternatively, the plurality of through holes 61 may be provided to have a combination of various shapes. In a specific implementation, a person skilled in the art may design a corresponding pattern shape according to actual needs, and details are not described here.

Figure 8:
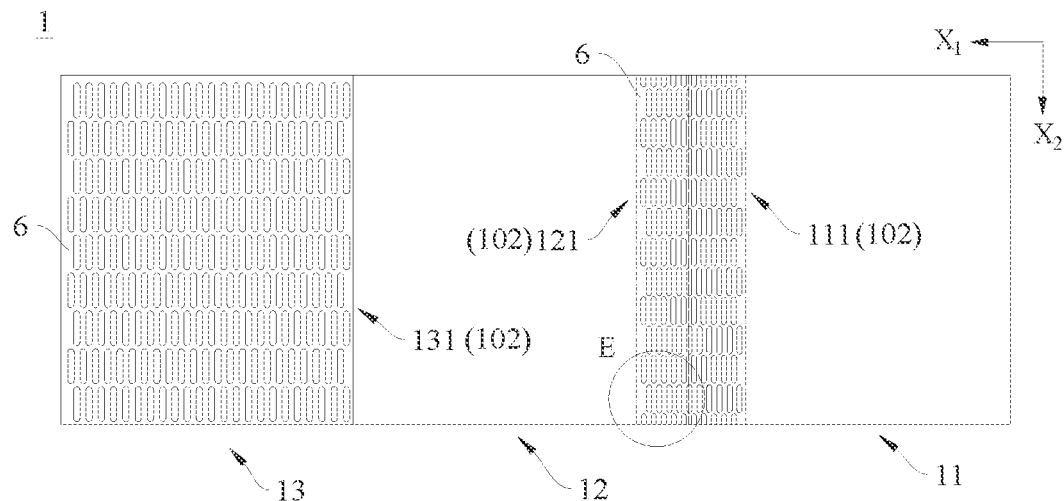
FIG. 8 is a bottom structural diagram of yet another support backplane, in accordance with some embodiments.
Figure 9:
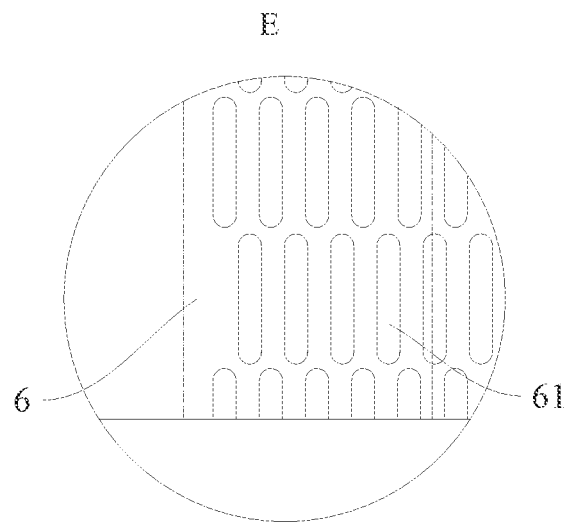
FIG. 9 is an enlarged partial diagram of the support backplane in FIG. 8 at E.

In some embodiments, referring to FIGS. 8 and 10, the first rollable flexible structure 111 includes the multi-stage rollable flexible structure 102, and the second rollable flexible structure 121 includes the multi-stage rollable flexible structure 102.

In an actual production, the first rollable flexible structure 111 and the second rollable flexible structure 121 may be manufactured by using an integrated forming process.

In some embodiments, referring to FIGS. 6 and 8, the third rollable flexible structure 131 includes the multi-stage rollable flexible structure 102.

The third rollable flexible structure 131 is the multi-stage rollable flexible structure 102, which may increase an overall rigidity of the third rollable flexible structure 131, thereby increasing a support force of the support backplane 1 at the third support portion 13.

In some embodiments, the support plate 6 is made of metal, such as a stainless steel (e.g., SUS304 or SUS316) or a titanium alloy. These materials have a suitable rigidity and toughness, and may meet the bending or folding requirements of the support backplane 1.

In some embodiments, referring to FIGS. 6 and 8 to 10, the plurality of through holes 61 in the multi-stage rollable flexible structure 102 are arranged in a plurality of rows. All of through holes 61 in each row are arranged at intervals in sequence in the first direction $X_1$.

The through holes 61 in each row may be set to have different shapes and sizes according to needs, so as to meet the folding or bending requirements at different positions.

In some embodiments, referring to FIGS. 6 and 8 to 10, through holes 61 in a row are staggered from through holes 61 in an adjacent row.

The through holes 61 in the row are staggered from the through holes 61 in the adjacent row, so that a mesh-like structure is formed on the support plate 6. In this way, the through holes 61 may be uniformly distributed, so that an overall performance of the support plate 6 is uniform.

Moreover, the mesh-like structure is conducive to maintaining an overall rigidity of the support plate 6 and increasing the deformability of the support plate 6. The through holes 61 that are staggered may uniformly release a deformation pressure.

In some embodiments, referring to FIGS. 6 and 8 to 10, the through holes 61 are strip-shaped holes extending in the second direction $X_2$ perpendicular to the first direction $X_1$. Widths of through holes 61 in a same row are equal.

The strip-shaped through hole 61 is used, and a long side of the trip-shaped through hole is in the second direction. Moreover, the widths of the through holes in the same row are equal, which may ensure that corresponding folding positions are uniformly stressed. A width of a through hole 61 in a row may be the same as or different from a width of a through hole 61 in a different row. For example, at a position with a large folding deformation, the widths of the through holes 61 in this row are appropriately increased, so that a pressure release capability during structural deformation may be improved.

In some embodiments, the through holes 61 are manufactured by etching.

In some examples, the etching may be dry etching or wet etching, and the specific etching needs to be selected according to the material of the support plate, the shapes and sizes of the through holes, and details are not described here.

Figure 11:
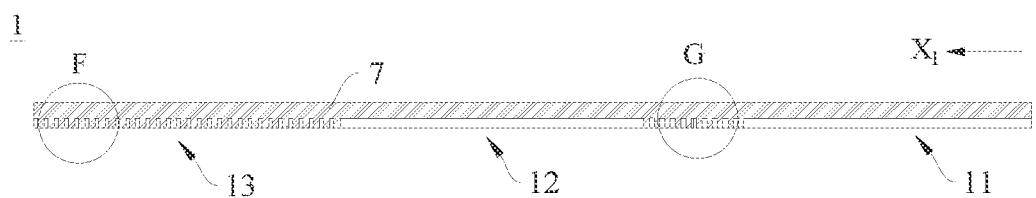
FIG. 11 is a bottom structural diagram of yet another support backplane, in accordance with some embodiments.

In some embodiments, referring to FIG. 11, the support backplane 1 in any one of the above embodiments further includes a flexible connection layer 7. The first support portion 11, the second support portion 12 and the third support portion 13 are disposed on a surface of the flexible connection layer 7.

The integrity and flexible deformability of the support backplane 1 may be improved by providing the flexible connection layer 7, thereby improving the supportability and anti-fatigue performance of the support backplane 1.

For example, the flexible connection layer 7 is made of an elastic material. For example, the flexible connection layer 7 includes at least one of organic silica gel, thermoplastic elastomer (TPE), or polyvinyl chloride (PVC).

For another example, the PVC is a soft PVC.

In some embodiments, the material of the flexible connection layer 7 includes silica gel. Alternatively, the flexible connection layer 7 is a silica gel layer formed by injection molding.

Figure 12:
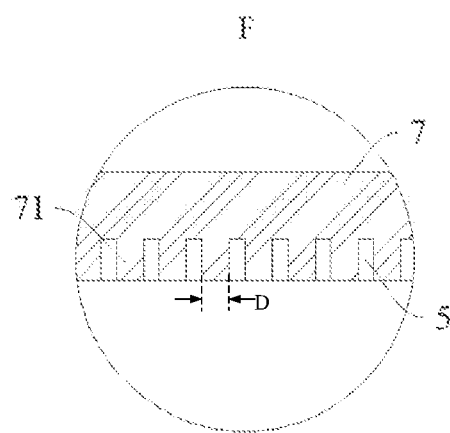
FIG. 12 is an enlarged partial diagram of the support backplane in FIG. 11 at F.
Figure 13:
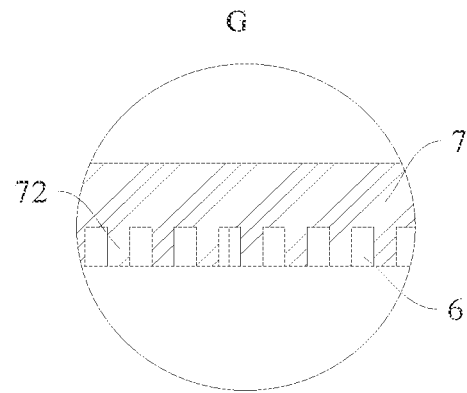
FIG. 13 is an enlarged partial diagram of the support backplane in FIG. 11 at G.

In some embodiments, referring to FIG. 12, in a case where the support backplane 1 includes the support strips 5, the flexible connection layer 7 includes first filling portions 71 each embedded into a gap D between adjacent support strips 5; and/or, referring to FIG. 13, in a case where the support backplane 1 includes the support plate 6 with the plurality of through holes 61, the flexible connection layer 7 includes second filling portions 72 each embedded into the through hole 61.

In some examples, referring to FIGS. 10 to 12, the third rollable flexible structure 131 is the single-stage rollable flexible structure 101, and the third rollable flexible structure 131 includes a plurality of identical support strips 5. Sections of the plurality of support strips 5 are all rectangular, and the plurality of support strips 5 are arranged at even intervals in the first direction $X_1$. Each support strip 5 extends in the second direction $X_2$. The plurality of support strips 5 have a same length, which is equal to both a length of the first support portion 11 and a length of the second support portion 12 in a same direction (i.e., the second direction $X_2$). The flexible connection layer 7 is disposed on surfaces of the first support portion 11, the second support portion 12 and the third support portion 13. Referring to FIG. 12, the flexible connection layer 7 is the silica gel layer formed by injection molding, and is embedded into the gap between adjacent support strips 5 to form the first filling portion 71. The plurality of support strips 5 are connected into a whole through the flexible connection layer 7. The support strips 5 may improve the support capability of the support backplane 1 at the third support portion 13, and the flexible connection layer 7 has a good elastic deformability, so that a structural deformation pressure may be released through the elastic deformation of the flexible connection layer 7 during the sliding and rolling.

In some other examples, referring to FIGS. 10, 11 and 13, the first rollable flexible structure 111 and the second rollable flexible structure 121 each include the multi-stage rollable flexible structure 102. The first rollable flexible structure 111 and the second rollable flexible structure 111 each include a plurality of rows of through holes 61. Through holes in each row are arranged in the first direction, and through holes in a row are staggered from through holes in an adjacent row. The through holes 61 are strip-shaped holes, and widths of the through holes 61 in each row are equal. The flexible connection layer 7 is the silica gel layer formed by injection molding, and is embedded into the through holes 61 to form the second filling portions 72. The flexible connection layer 7 has a good elastic deformability, and may release the pressure generated when the support backplane 1 is folded through the elastic deformation.

Figure 14:
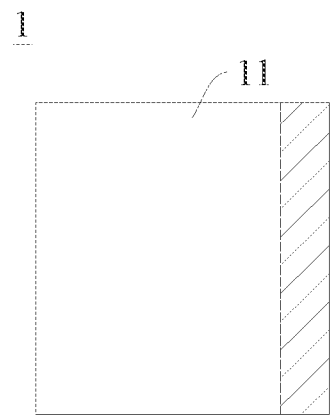
FIG. 14 is a front structural diagram of a support backplane that is completely folded, in accordance with some embodiments.
Figure 15:
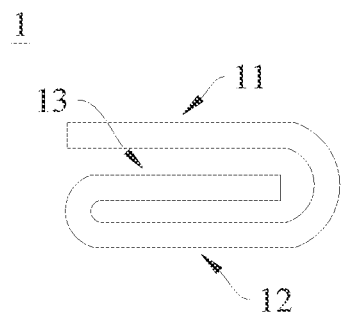
FIG. 15 is a bottom structural diagram of a support backplane that is completely folded, in accordance with some embodiments.
Figure 16:
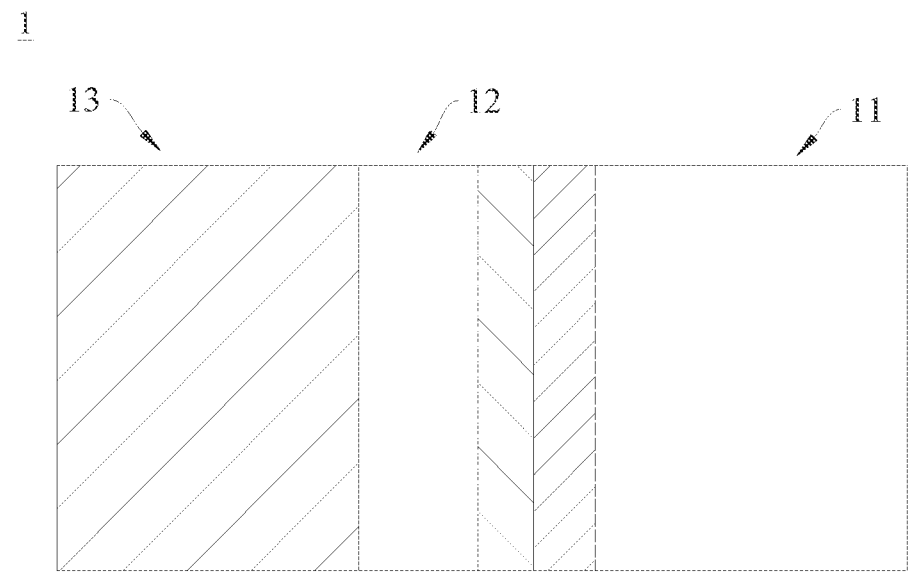
FIG. 16 is a front structural diagram of a support backplane that is half unfolded, in accordance with some embodiments.
Figure 17:
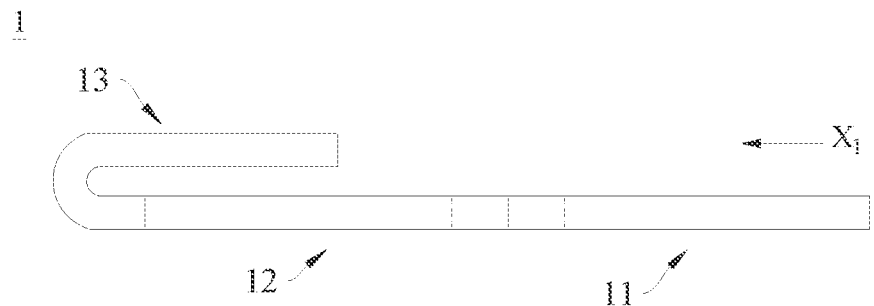
FIG. 17 is a bottom structural diagram of a support backplane that is half unfolded, in accordance with some embodiments.

In some embodiments, referring to FIGS. 14 and 15, when the support backplane 1 is in a completely folded state, the first support portion 11 and the second support portion 12 are folded through the first rollable flexible structure 111 and the second rollable flexible structure 121 matched with the first rollable flexible structure 111. After being folded, the first support portion 11 and the second support portion 12 are arranged face to face or back to back. The third support portion is stored between the first support portion 11 and the second support portion 12 by the rolling of the third rollable flexible structure 131. In this storage structure, the movement of the foldable structure and the movement of the slidably rolled structure are not limited by each other. That is, when the first support portion 11 and the second support portion 12 are in the folded state, the third support portion 13 may be rolled up or unfolded freely. When the third support portion 13 is in a roll-up state, the foldable structure between the first support portion 11 and the second support portion 12 may be unfolded or folded. Referring to FIGS. 16 and 17, the first support portion 11 and the second support portion 12 are unfolded, and the third support portion 13 is in a half-unfolded state. The third support portion 13 is slidably rolled up or unfolded in the first direction $X_1$, and the first direction $X_1$ is a direction in which the first support portion 11, the second support portion 12 and the third support portion 13 are arranged in sequence.

Figure 18:
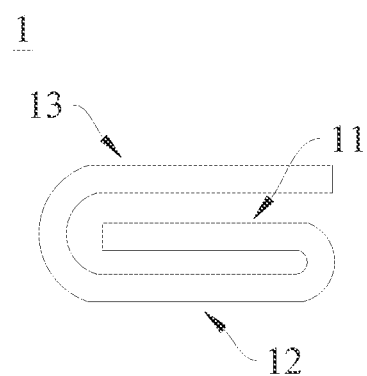
FIG. 18 is a bottom structural diagram of another support backplane that is completely folded, in accordance with some embodiments.

In some other examples, referring to FIG. 18, the first support portion 11 may be stored between the second support portion 12 and the third support portion 13. In this storage state, the movement of the foldable structure between the first support portion 11 and the second support portion 12 is limited by the third support portion 13. That is, only when the third support portion 13 is unfolded, the foldable structure between the first support portion 11 and the second support portion 12 may be unfolded or folded. A storage sequence and a positional relationship of the first support portion 11, the second support portion 12 and the third support portion 13 are set according to specific requirements, and details are not described here.

In summary, the support backplane 1 in some embodiments of the present disclosure includes three support portions, i.e., the first support portion 11, the second support portion 12 and the third support portion 13. The first support portion 11 and the second support portion 12 have the foldable structure, and the third support portion 13 is integrally designed to be the rollable flexible structure, and is connected to the second support portion 12, so that the third support portion 13 may be completely unfolded or partially unfolded after the first support portion 11 and the second support portion 12 are completely unfolded. In this design, the overall appearance size of the electronic device having the support backplane 1 may be reduced by folding and rolling up, and the size of the display area of the electronic device may be increased by unfolding. Therefore, in the case of a certain folding size of the electronic device, the size of the display area may be linearly adjusted within a certain range according to needs, which helps to improve the user experience.

The foregoing descriptions are merely specific implementation manners of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A support backplane, comprising a first support portion, a second support portion and a third support portion that are connected in sequence; wherein
the first support portion has a first rollable flexible structure in a first area, and the first area is a partial area of the first support portion;
the second support portion has a second rollable flexible structure in a second area, and the second area is a partial area of the second support portion; and the second rollable flexible structure is matched with the first rollable flexible structure, so as to constitute a foldable structure in the first area and the second area; and
the third support portion has a third rollable flexible structure in an entire area of the third support portion, so that the third support portion integrally constitutes a slidably rolled structure that is able to be unfolded or rolled up, wherein
the first rollable flexible structure includes a single-stage rollable flexible structure; or
the second rollable flexible structure includes the single-stage rollable flexible structure; or
the third rollable flexible structure includes the single-stage rollable flexible structure; or
each of the first rollable flexible structure and the second rollable flexible structure includes the single-stage rollable flexible structure; or
each of the first rollable flexible structure and the third rollable flexible structure includes the single-stage rollable flexible structure; or
each of the second rollable flexible structure and the third rollable flexible structure includes the single-stage rollable flexible structure; or
each of the first rollable flexible structure, the second rollable flexible structure and the third rollable flexible structure includes the single-stage rollable flexible structure,
wherein the single-stage rollable flexible structure includes a plurality of support strips arranged according to a predetermined layout,
wherein the predetermined layout includes a case that: the plurality of support strips are independent of each other and arranged at intervals in sequence in a first direction;
wherein when the support backplane is in a completely folded state,
the first support portion, the second support portion and the third support portion are parallel to each other, and
the first support portion is stored between the second support portion and the third support portion; and
when the third support portion in a completely unfolded state, an end of the third support portion away from the second support portion exhibits a U-shaped folded structure.

2. The support backplane according to claim 1, wherein
the first area is a partial area of the first support portion close to the second support portion, and the second area is a partial area of the second support portion close to the first support portion; and the first area is adjacent to the second area; and
the first rollable flexible structure is connected to the second rollable flexible structure.

3. The support backplane according to claim 1, wherein
the first support portion, the second support portion and the third support portion are connected in sequence in the first direction.

4. The support backplane according to claim 1, wherein
the predetermined layout further includes a case that each of the plurality of support strips extends in a second direction perpendicular to the first direction.

5. The support backplane according to claim 1, further comprising:
a flexible connection layer, the first support portion, the second support portion and the third support portion being disposed on a surface of the flexible connection layer.

6. The support backplane according to claim 5, wherein
the flexible connection layer includes first filling portions each embedded into a gap between adjacent support strips.

7. The support backplane according to claim 5, wherein
a material of the flexible connection layer includes silica gel; or
the flexible connection layer is a silica gel layer formed by injection molding.

8. A flexible display screen, comprising:
the support backplane according to claim 1.

9. An electronic device, comprising:
the flexible display screen according to claim 8.

10. A support backplane, comprising a first support portion, a second support portion and a third support portion that are connected in sequence; wherein
the first support portion has a first rollable flexible structure in a first area, and the first area is a partial area of the first support portion;
the second support portion has a second rollable flexible structure in a second area, and the second area is a partial area of the second support portion; and the second rollable flexible structure is matched with the first rollable flexible structure, so as to constitute a foldable structure in the first area and the second area; and
the third support portion has a third rollable flexible structure in an entire area of the third support portion, so that the third support portion integrally constitutes a slidably rolled structure that is able to be unfolded or rolled up, wherein the first rollable flexible structure includes a multi-stage rollable flexible structure; or the second rollable flexible structure includes the multi-stage rollable flexible structure; or the third rollable flexible structure includes the multi-stage rollable flexible structure;

each of the first rollable flexible structure and the second rollable flexible structure includes the multi-stage rollable flexible structure; or each of the first rollable flexible structure and the third rollable flexible structure includes the multi-stage rollable flexible structure; or each of the second rollable flexible structure and the third rollable flexible structure includes the multi-stage rollable flexible structure; or each of the first rollable flexible structure, the second rollable flexible structure and the third rollable flexible structure includes the multi-stage rollable flexible structure, wherein the multi-stage rollable flexible structure is a support plate with a plurality of through holes, wherein the first support portion, the second support portion and the third support portion are connected in sequence in a first direction; the plurality of through holes in the multi-stage rollable flexible structure are arranged in a plurality of rows, and all of through holes in each row are arranged at intervals in sequence in the first direction, wherein through holes in a row are staggered from through holes in an adjacent row; and along a second direction perpendicular to the first direction, a gap exists between each of the through holes in the row and each of the through holes in the adjacent row;

wherein when the support backplane is in a completely folded state, the first support portion, the second support portion and the third support portion are parallel to each other, and the first support portion is stored between the second support portion and the third support portion; and when the third support portion in a completely unfolded state, an end of the third support portion away from the second support portion exhibits a U-shaped folded structure.

11. The support backplane according to claim 10, wherein the plurality of through holes are strip-shaped holes extending in the second direction; and widths of through holes in a same row are equal.

12. The support backplane according to claim 10, wherein the plurality of through holes are manufactured by etching.

13. The support backplane according to claim 10, wherein the first area is a partial area of the first support portion close to the second support portion, and the second area is a partial area of the second support portion close to the first support portion; and the first area is adjacent to the second area; and the first rollable flexible structure is connected to the second rollable flexible structure.

14. The support backplane according to claim 10, wherein the first support portion, the second support portion and the third support portion are connected in sequence in the first direction.

15. The support backplane according to claim 10, further comprising:

a flexible connection layer, the first support portion, the second support portion and the third support portion being disposed on a surface of the flexible connection layer.

16. The support backplane according to claim 15, wherein the flexible connection layer includes second filling portions each embedded into a through hole in the plurality of through holes.

17. The support backplane according to claim 15, wherein a material of the flexible connection layer includes silica gel; or the flexible connection layer is a silica gel layer formed by injection molding.

18. A flexible display screen, comprising:

the support backplane according to claim 10.

19. An electronic device, comprising:

the flexible display screen according to claim 18.

20. A support backplane, comprising a first support portion, a second support portion and a third support portion that are connected in sequence in a first direction; wherein the first support portion has a first rollable flexible structure in a first area, and the first area is a partial area of the first support portion;

the second support portion has a second rollable flexible structure in a second area, and the second area is a partial area of the second support portion; and the second rollable flexible structure is matched with the first rollable flexible structure, so as to constitute a foldable structure in the first area and the second area; and the third support portion has a third rollable flexible structure in an entire area of the third support portion, so that the third support portion integrally constitutes a slidably rolled structure that is able to be unfolded or rolled up, wherein each of the first rollable flexible structure and the second rollable flexible structure includes a single-stage rollable flexible structure, and the third rollable flexible structure includes a multi-stage rollable flexible structure; or, each of the first rollable flexible structure and the second rollable flexible structure includes the multi-stage rollable flexible structure, and the third rollable flexible structure includes the single-stage rollable flexible structure, wherein the single-stage rollable flexible structure includes a plurality of support strips arranged according to a predetermined layout; and the predetermined layout includes a case that: the plurality of support strips are independent of each other and arranged at intervals in sequence in the first direction;

wherein the multi-stage rollable flexible structure is a support plate with a plurality of through holes;

the plurality of through holes in the multi-stage rollable flexible structure are arranged in a plurality of rows, and all of through holes in each row are arranged at intervals in sequence in the first direction; and through holes in a row are staggered from through holes in an adjacent row; and along a second direction perpendicular to the first direction, a gap exists between each of the through holes in the row and each of the through holes in the adjacent row;

wherein when the support backplane is in a completely folded state, the first support portion, the second support portion and the third support portion are parallel to each other, and the first support portion is stored between the second support portion and the third support portion; and when the third support portion in a completely unfolded state, an end of the third support portion away from the second support portion exhibits a U-shaped folded structure.

\* \* \* \* \*

UNITED STATES PATENT AND TRADEMARK OFFICE
CERTIFICATE OF CORRECTION

PATENT NO. : 12,416,945 B2  
APPLICATION NO. : 17/790860  
DATED : September 16, 2025  
INVENTOR(S) : Zhihao Xie, Binfeng Feng and Bowen Xiao Page 1 of 1

It is certified that error appears in the above-identified patent and that said Letters Patent is hereby corrected as shown below:

In the Specification

Column 3, Lines 12-13, "FIG. 10 is a structural diagram of another flexible display screen" should read --FIG. 1C is a structural diagram of another flexible display screen--.

Signed and Sealed this  
Tenth Day of February, 2026

John A. Squires  
*Director of the United States Patent and Trademark Office*